United States Patent
Benveniste et al.

(10) Patent No.: US 6,835,930 B2
(45) Date of Patent: Dec. 28, 2004

(54) HIGH MASS RESOLUTION MAGNET FOR RIBBON BEAM ION IMPLANTERS

(75) Inventors: Victor M. Benveniste, Gloucester, MA (US); Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/753,731

(22) Filed: Jan. 8, 2004

(65) Prior Publication Data

US 2004/0227074 A1 Nov. 18, 2004

Related U.S. Application Data

(62) Division of application No. 10/606,087, filed on Jun. 25, 2003.
(60) Provisional application No. 60/470,926, filed on May 15, 2003.

(51) Int. Cl.[7] .......................... H01J 49/30; B01D 59/44
(52) U.S. Cl. ..................... 250/298; 250/281; 250/282
(58) Field of Search ........................ 250/298, 282, 250/281, 396 R, 492.2, 492.21, 396 ML, 398, 492.3

(56) References Cited

U.S. PATENT DOCUMENTS

| | | | | |
|---|---|---|---|---|
| 5,311,028 A | * | 5/1994 | Glavish | 250/492.21 |
| 5,393,984 A | * | 2/1995 | Glavish | 250/396 ML |
| 5,481,116 A | * | 1/1996 | Glavish et al. | 250/396 ML |
| 5,483,077 A | * | 1/1996 | Glavish | 250/492.2 |
| 5,757,018 A | | 5/1998 | Mack et al. | |
| 6,160,262 A | | 12/2000 | Aoki et al. | |
| 6,693,283 B2 | * | 2/2004 | Eickhoff et al. | 250/396 ML |

OTHER PUBLICATIONS

"Tuning Permanent Magnets With Adjustable Field Clamps", R.I. Schermer, IEEE, PAC, 1987, pp. 1514–1516.
"Large Permanent Magnet Dipole Performance", G.A. Novikov, N.I. Pakhomov, V.I. Shvedunov, V.S. Skachov and W.P. Trower, IEEE, Proceedings of the 2001 Particle Accelerator Conference, Chicago. pp. 3227–3229.
"New Type of Permanent Magnet Beam Line Optics", S.C. Gottschalk, W.D. Kimura and D.H. Dowell, IEEE, Proceedings of the 2001 Particle Accelerator Conference, Chicago. pp. 3218–3220.
"Charged Particle Beams", Acceleration and Transport of Neutralized Ion Beams, Stanley Humphries, Jr., 1990, pp. 528–534.

* cited by examiner

Primary Examiner—Jack Berman
Assistant Examiner—Johnnie L Smith, II
(74) Attorney, Agent, or Firm—Eschweiler & Associates, LLC

(57) ABSTRACT

A mass analyzer for a ribbon shaped ion beam is disclosed. The mass analyzer comprises a pair of coils that define an entrance end and an exit end of the analyzer. Field clamps are employed at or proximate to one or more of the entrance and exit ends of the mass analyzer. The field clamps operate to terminate fringing fields close to the entrance and exit ends of the mass analyzer, thereby reducing the impact of such fringing fields on the ribbon beam and improving beam uniformity.

11 Claims, 12 Drawing Sheets

HIGH MASS RESOLUTION MAGNET FOR RIBBON BEAM ION IMPLANTERS

RELATED APPLICATIONS

This application is a divisional of Ser. No. 10/606,087 filed Jun. 25, 2003, which is entitled "High Mass Resolution Magnet for Ribbon Beam Ion Implanters". which claims priority to Ser. No. 60/470,926 filed May 15, 2003 which is entitled "High Mass Resolution Magnet for Ribbon Beam Ion Implanters."

FIELD OF THE INVENTION

The present invention relates generally to ion implantation systems, and more particularly to a mass analyzer and method associated therewith to mass analyze a ribbon shaped ion beam.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

In order to achieve a desired implantation for a given application, the dose and energy of the implanted ions may be varied. The ion dose controls the concentration of implanted ions for a given semiconductor material. Typically, high current implanters are used for high dose implants, while medium current implanters are used for lower dose applications. The ion energy is used to control junction depth in semiconductor devices, where the energy levels of the beam ions determine the degree to which ions are implanted or the depth of the implanted ions within the semiconductor or other substrate material. The continuing trend toward smaller semiconductor devices requires a mechanism that serves to deliver high beam currents at low energies. The high beam current provides the necessary dose levels, while the low energy permits shallow implants.

In most prior art systems, ion implantation employed a pencil-type ion beam, wherein a relatively narrow beam was produced by the ion source and subjected to mass analysis, subsequent beam conditioning, and scanning before reaching the workpiece. Many present applications, however, wish to obtain shallow implants with a relatively high dopant concentration, for example, in shallow source/drain regions in semiconductor manufacturing. For shallow depth ion implantation, high current, low energy ion beams are desirable. In this case, the reduced energies of the ions cause some difficulties in maintaining convergence of the ion beam due to the mutual repulsion of ions bearing a like charge. High current ion beams typically include a high concentration of similarly charged ions that tend to diverge due to mutual repulsion. One solution to the above problem is to employ a ribbon-type ion beam instead of a pencil-type beam. One advantage of the ribbon-type beam is that the cross-sectional area of the beam is substantially larger than the pencil-type beam. For example, a typical pencil beam has a diameter of about 1–5 cm, wherein a ribbon-type beam may have a height of about 1–5 cm and a width of about 40 cm. With the substantially larger beam area, a given beam current has substantially less current density, and the beam a lower perveance. Use of a ribbon-type beam, however, has a number of unique challenges associated therewith.

In ion implantation systems, there remains a need for a ribbon beam ion implantation system that provides a uniform ribbon beam at the workpiece.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an ion implantation system operable to generate a ribbon shaped ion beam and direct such a beam along a beamline path toward a workpiece. The implantation system comprises a mass analyzer operable to receive the ribbon shaped ion beam and deflect such beam along an arcuate path for mass analysis thereof. The mass analyzer of the present invention is configured to effectuate such mass analysis with minimal beam distortion.

In accordance with one aspect of the present invention, a ribbon beam ion implantation system is disclosed having a ribbon beam ion source, a mass analysis system, and an end station. The mass analysis system has an entrance end and an exit end, and is operable to deflect selected ions having a desired charge-to-mass ratio within the ribbon beam along a predetermined arcuate path from the entrance end to the exit end thereof. The mass analysis system further comprises a field clamp located proximate the entrance end, the exit end or both the entrance and exit ends. The field clamp is operable to substantially terminate fringing fields associated with the mass analysis system, thereby reducing beam distortion and improving beam uniformity.

In another aspect of the invention, the field clamp comprises a pair of ferromagnetic members extending in a direction associated with a width of the ribbon beam. When located on the entrance end of the mass analysis system, the ferromagnetic members, for example, iron, act to substantially prevent fringing fields from extending beyond the clamp, thereby reducing substantially an extent of the fringing fields at the entrance end of the mass analyzer. Consequently, ribbon beam distortion associated with fringing fields at the entrance end of the mass analyzer is reduced. Similarly, a pair of ferromagnetic members extending in the width direction of the ribbon beam may be located proximate the exit end of the mass analyzer, and operate to prevent fringing fields from extending from the exit mass analysis system beyond the clamp. Accordingly, the extent of the fringing fields from the exit end of the mass analysis system is greatly reduced, thereby reducing beam distortion associated therewith and providing improved ribbon beam uniformity.

In yet another aspect of the present invention, the mass analysis system comprises a pair of coils extending arcuately and defining the beamline path therebetween. A first coil of the pair resides above the beam and extends along the entire width thereof, while the second coil of the pair resides below the beam and also extends along the entire beam width. By generating a current in the coils, a dipole magnetic field is generated between the coils that operates to deflect the desired ions within the beam along the arcuate path. While the dipole field between the coils along the beamline path is substantially uniform, fringing fields extend from the entrance end and the exit end due to, among other things, a magnetic field gradient along the beamline path. Such fringing fields may have transverse, non-uniform components along the width of the beam and operate to provide beam distortion along the width. The field clamps of the present invention operate to substantially terminate the fringing fields proximate the entrance and exit ends, respectively. Thus the ribbon beam traveling along the beamline path is exposed to fringing fields for a substantially smaller duration of time and thus distortion associated with such fringing fields is substantially reduced.

In still another aspect of the present invention, one or more pairs of secondary coils are employed in conjunction with the primary coils, wherein the secondary coils also extend along the arcuate passageway. The one or more pairs of secondary coils may overlie the primary coils or may extend along sidewall portions of the guide to provide further magnetic field compensation. In one example, such compensation is a function of a beam uniformity determination at the workpiece, wherein such compensation operates to compensate for distortion of the ribbon beam due to, for example, fringing fields or other factors despite the substantial reduction of the impacts of such fringing fields by the field clamps.

In accordance with still another aspect of the present invention, a method of mass analyzing a ribbon beam is disclosed. The method comprises generating a ribbon shaped ion beam, and sending such beam along a beamline path. A dipole magnetic field is generated along the beamline path to deflect selected ions in the ribbon beam upon a predetermined arcuate path according to a desired charge-to-mass ratio. Fringing fields associated with at least an entrance or exit portion of the dipole magnetic field are reduced to prevent beam distortion associated therewith. In one example, the fringing fields are reduced by providing a field clamp proximate the entrance or exit end of the dipole magnetic field such that a ribbon beam traveling along the beamline path is exposed to such fringing fields for a shorter duration of time, thereby reducing beam distortion associated therewith and providing improved ribbon beam uniformity.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
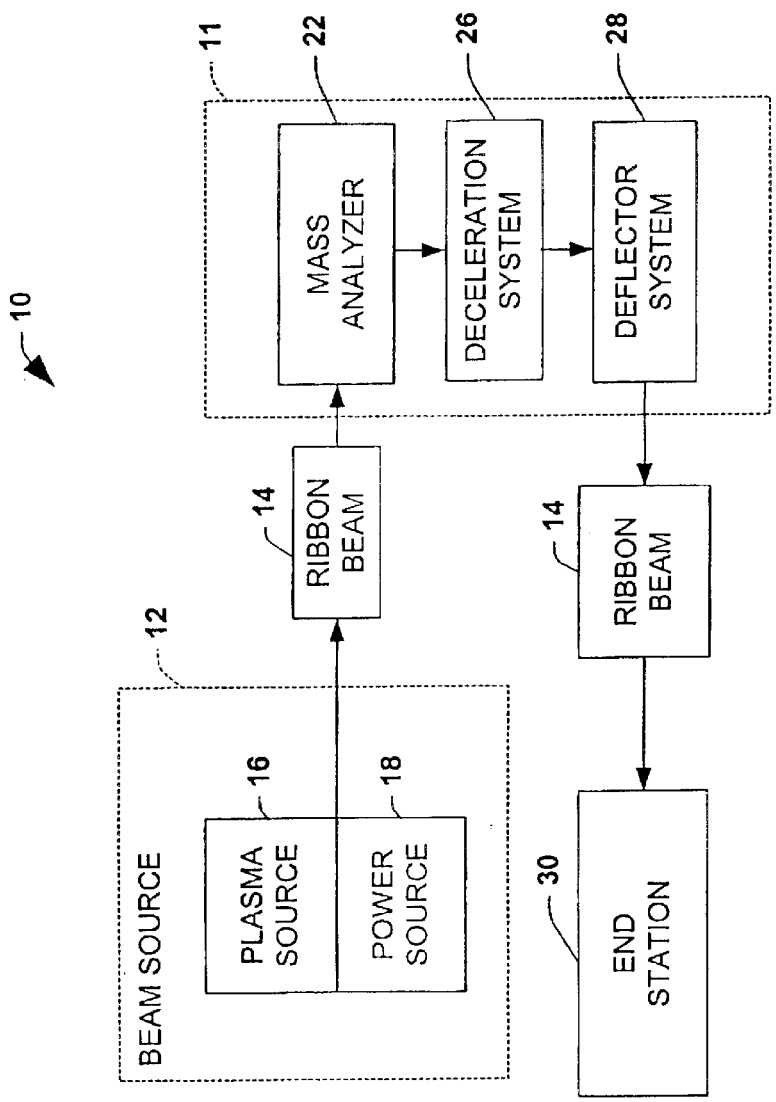
FIG. 1 is a schematic block diagram illustrating components of an exemplary ion implantation system in accordance with one or more aspects of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention pertains to a system and method of mass analyzing a ribbon shaped ion beam. Beam distortion is reduced, resulting in improved beam uniformity along a width thereof by reducing an extent of fringing fields from one or both of the entrance and exit ends of the mass analyzer. Reduction in fringing fields is obtained by providing field clamps proximate the entrance and exit ends thereof. The field clamps substantially terminate the fringing fields thereat, thereby preventing such fields from extending from the mass analyzer beyond the clamps. Thus the ribbon beam, traveling along the beamline path at a given beam propagation velocity, are exposed to such fringing fields for a substantially reduced period of time compared to conventional systems, and thus beam distortion due to such fringing fields is reduced. A further appreciation of the invention, along with the various aspects thereof will be further understood in accordance with the detailed description below.

Referring initially to FIG. 1, an ion implantation system 10 suitable for implementing one or more aspects of the present invention is depicted in block diagram form. The system 10 includes an ion source 12 for producing an ion beam 14 along a beam path. The ion beam source 12 includes, for example, a plasma source 16 with an associated power source 18. The plasma source 16 may, for example, comprise a plasma confinement chamber from which an ion beam is extracted. The extracted beam comprises a ribbon shaped ion beam, for example, having a width of about 400 mm for implantation of a 300 mm semiconductor wafer. One exemplary ribbon beam that may be employed in conjunction with the present invention is disclosed in U.S. application Ser. No. 10/136,047, filed on May 1, 2002, and assigned to the assignee of the present invention, and is hereby incorporated by reference in its entirety.

A beamline assembly 11 is provided downstream of the ion source 12 to receive the ribbon beam 14 therefrom. The beamline assembly 11 may include a mass analyzer 22, a deceleration system 26, and a deflector system 28. The beamline assembly 11 is situated along the path to receive the beam 14. The mass analyzer 22 includes a field generating component, such as a magnet (not shown), and operates to provide a field across the beam path so as to deflect ions from the ion beam 14 at varying trajectories according to the charge-to-mass ratio of the respective ions. Ions traveling through the magnetic field experience a force which directs individual ions of a desired mass along the beam path and which deflects ions of undesired mass away from the beam path.

The beamline 11 may further comprise a deceleration module 26 that is controllable and selectively operable to alter an energy associated with the ribbon beam. For example, at medium energies no substantial change in ribbon beam energy may be necessary, and the module allows the ribbon beam to pass therethrough without a substantial change thereto. Alternatively, in low energy applications (e.g., for formation of shallow junctions in a semiconductor body), the energy of the ribbon beam may need to be decelerated. In such circumstances, the deceleration module 26 is operable to reduce the energy of the beam to a desired energy level by deceleration thereof.

The beamline may further comprise a deflection system 28, for example, for use in low energy systems that employ deceleration prior to implantation into a workpiece. The deflection system 28 includes, for example, deflection electrodes for deflecting the ion beam away from the beamline axis to thereby remove neutral particles from the ribbon beam (due to their failure to deflect in the presence of a deflecting field) that may otherwise serve as energy contaminants.

Continuing with FIG. 1, an end station 30 is also provided in the system 10 to receive the mass analyzed, substantially decontaminated ion beam 14 from the beamline assembly 11. The end station 30 supports one or more workpieces such as semiconductor wafers (not shown) along the beam path (however, offset from the original beamline axis due to the deflector 28) for implantation using the ribbon ion beam 14. Note that such an end station contemplates use of a batch system, wherein multiple workpieces are rotated path the ribbon beam, or a single workpiece end station, wherein a single workpiece is scanned path the ribbon beam or the ribbon beam is scanned across the workpiece, respectively.

Figure 2:
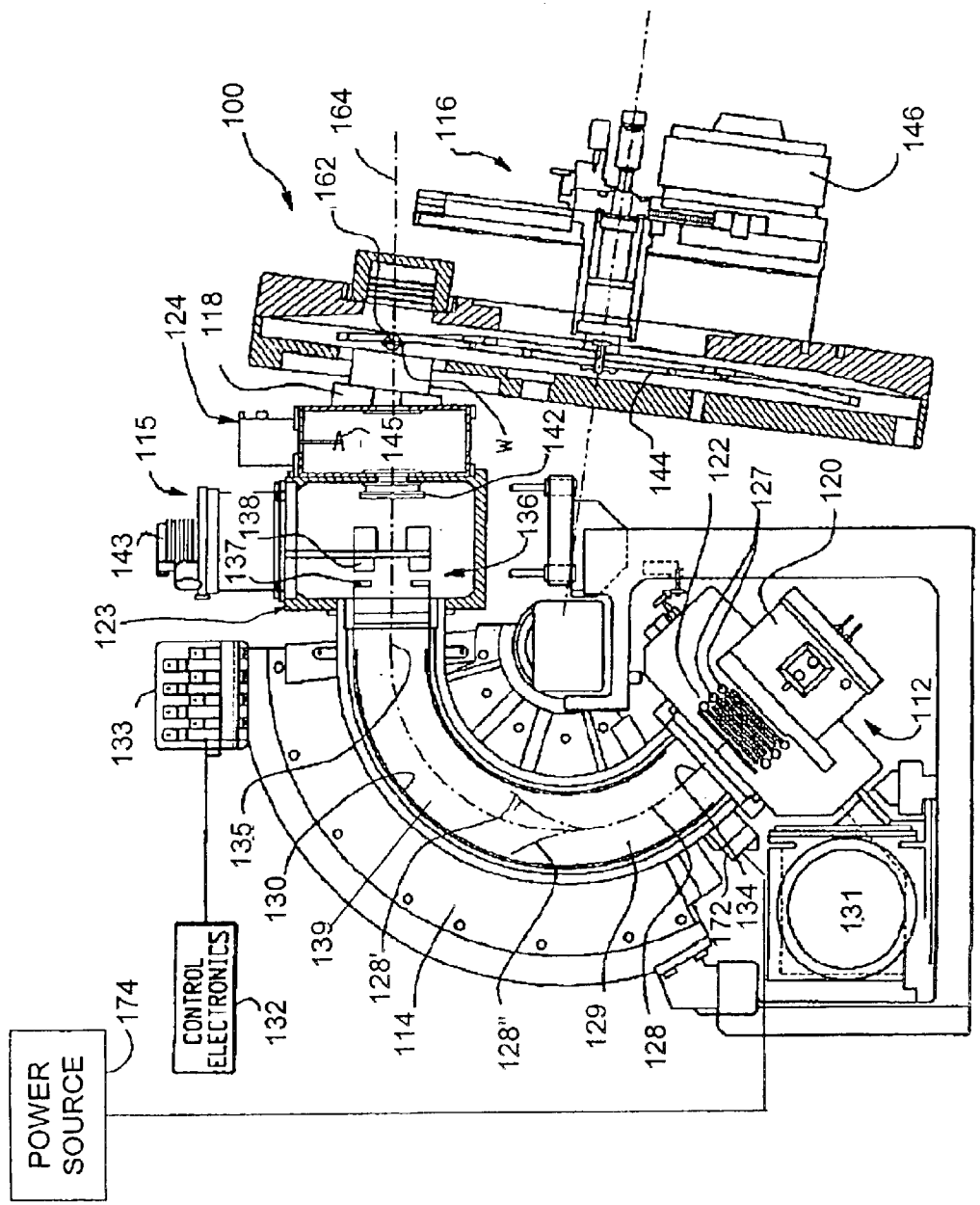
FIG. 2 is a schematic view of a low energy type ion implantation system in which various aspects of the invention may be carried out.

Referring also to FIG. 2, an exemplary low energy ion implanter 100 is illustrated in greater detail in order to appreciate various aspects of the present invention. The implanter 100 has an ion source 112, a mass analysis magnet 114, a beamline assembly 115, and a target or end station 116. A bellows assembly 118, which permits movement of the end station 116 with respect to the beamline assembly 115, connects the end station 116 and the beamline assembly 115. Although FIG. 2 illustrates an ultra low energy (ULE) ion implanter, as will be appreciated, the present invention has applications in other types of implanters as well.

The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The mass analysis magnet 114 functions to pass only ions of an appropriate charge-to-mass ratio to the beamline assembly 115, which comprises a resolver housing 123 and a beam neutralizer 124. The mass analysis magnet 114 includes a curved beam path 129 within a passageway 139 defined by a beam guide having sidewalls 130, evacuation of which is provided by a vacuum pump 131. The ion beam 128 that propagates along this path 129 is affected by the magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133.

The dipole magnetic field causes the ion beam 128 to move along the curved beam path 129 from a first or entrance trajectory 134 near the ion source 112 to a second or exit trajectory 135 near the resolving housing 123. Portions 128' and 128" of the beam 128, comprised of ions having an inappropriate charge-to-mass ratio, are deflected away from the curved trajectory and into the walls of an aluminum beam guide 130. In this manner, the magnet 114 passes to the resolving housing 123 only those ions in the beam 128 that have the desired charge-to-mass ratio.

The resolver housing 123 includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer and resolver housings are evacuated by a vacuum pump 143.

Downstream of the beam neutralizer 124 is the end station 116, which includes a disk-shaped wafer support 144 upon which workpieces such as wafers to be treated are mounted. The wafer support 144 resides in a target plane that is generally perpendicularly oriented to the direction of the implant beam. The disc shaped wafer support 144 at the end station 116 is rotated by a motor 146. The ion beam thus strikes wafers mounted to the support as they move in a circular path. The end station 116 pivots about point 162, which is the intersection of the path 164 of the ion beam and the wafer W, so that the target plane is adjustable about this point. Although FIG. 2 illustrates a batch type processing system, it should be understood that the present invention is also applicable to single wafer type processing systems.

Figure 3:
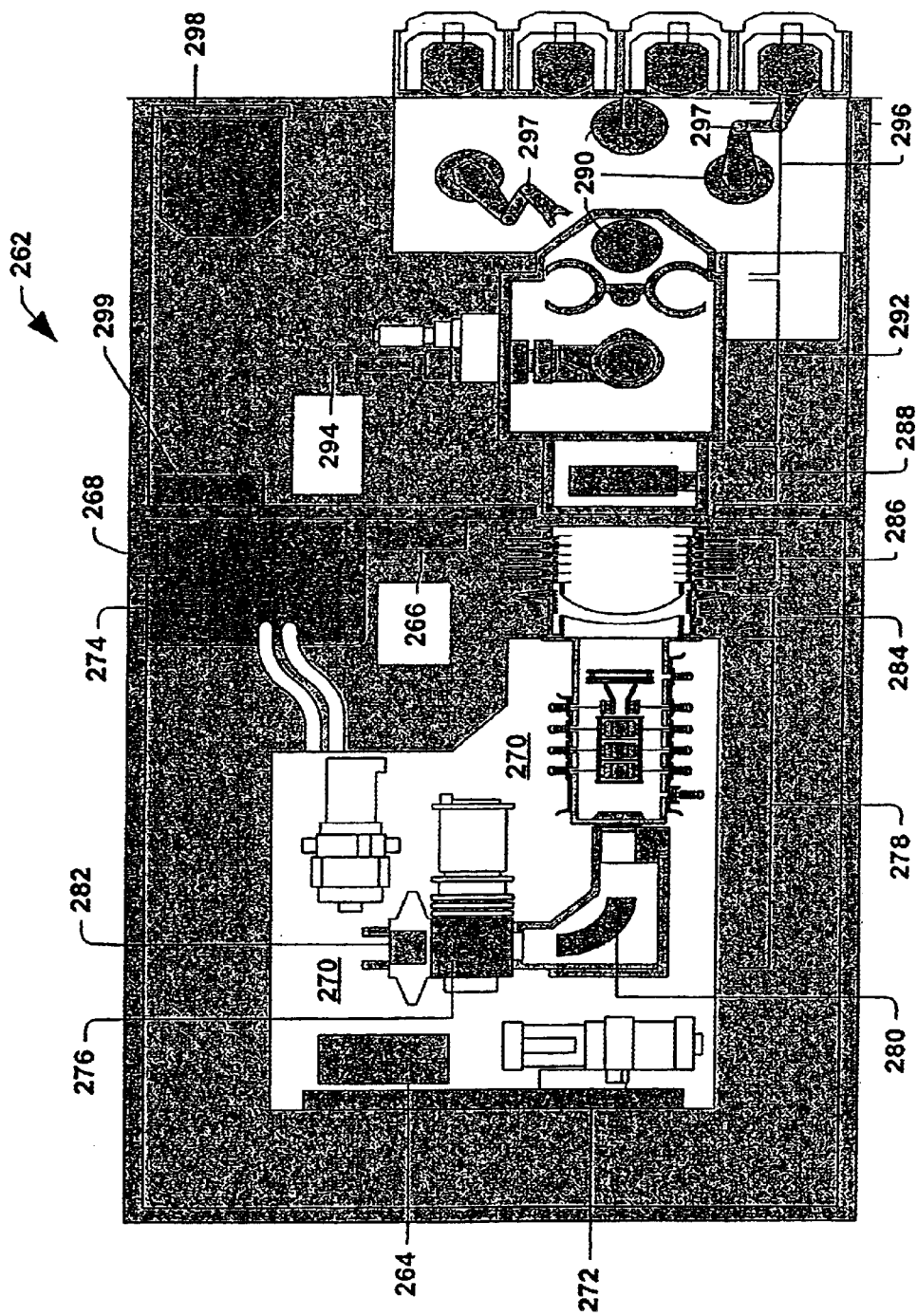
FIG. 3 is a schematic view of a medium current type ion implantation system in which various aspects of the invention may be carried out.

FIG. 3 illustrates yet another ion implantation system 262, for example, a medium current system suitable for implementing one or more aspects of the present invention. The system 262 includes a modular gas box 264, an auxiliary gas box 266 and a gas box remote purge control panel 268. The gas boxes 264, 268 comprise, among other things, one or more gases of a dopant substance, and the boxes 264, 268 facilitate selective delivery of the gas(es) into an extended life ion source 282 within the system 262, wherein the gas(es) can be ionized to generate ions suitable for implantation into wafers or workpieces selectively brought into the system 262. The gas box remote control panel 268 facilitates venting or purging gas(es) or other substances out of the system 262 on an as needed or desired basis.

High voltage terminal power distribution 272 and a high voltage isolation transformer 274 are included to, among other things, electrically excite and impart energy to the dopant gas(es) to generate ions from the gas(es). An ion beam extraction assembly 276 is included to extract ions from the ion source 282 and accelerate them into a beamline 278, which includes a mass analysis magnet 280. The mass analysis magnet 280 is operable to sort out or reject ions of an inappropriate charge-to-mass ratio. In particular, the mass analysis magnet 280 comprises a beamguide having curved sidewalls into which ions of an undesired mass-to-charge ratio collide as they are propagated through the beamguide by way of one or more magnetic fields generated by magnet(s) of the mass analysis magnet 280.

A component 284 may be included to assist with controlling the angle of the scanned ion beam, however, this feature may not be necessary for ribbon type beams. This may include, among other things, a scan angle correction lens. An acceleration/deceleration column 286 facilitates controlling and adjusting the speed, and/or focusing, of ions within the ion beam. A component 288 operable to filter out contaminant particles, such as a final energy filter may also be included to mitigate energy contaminating particles from encountering wafers or workpieces.

Wafers or workpieces 290 are loaded into an end station chamber 292 for selective implantation with ions. A mechanical scan drive 294 maneuvers the wafers within the chamber 292 to facilitate selective encounters with the beam(s). The wafers or workpieces 290 are moved into the end station chamber 292 by a wafer handling system 296, which may include, for example, one or more mechanical or robotic arms 297. An operator console 298 allows an operator to regulate the implantation process by selectively controlling one or more components of the system 262. Finally, a power distribution box 299 is included to provide power to the overall system 262.

Figure 4:
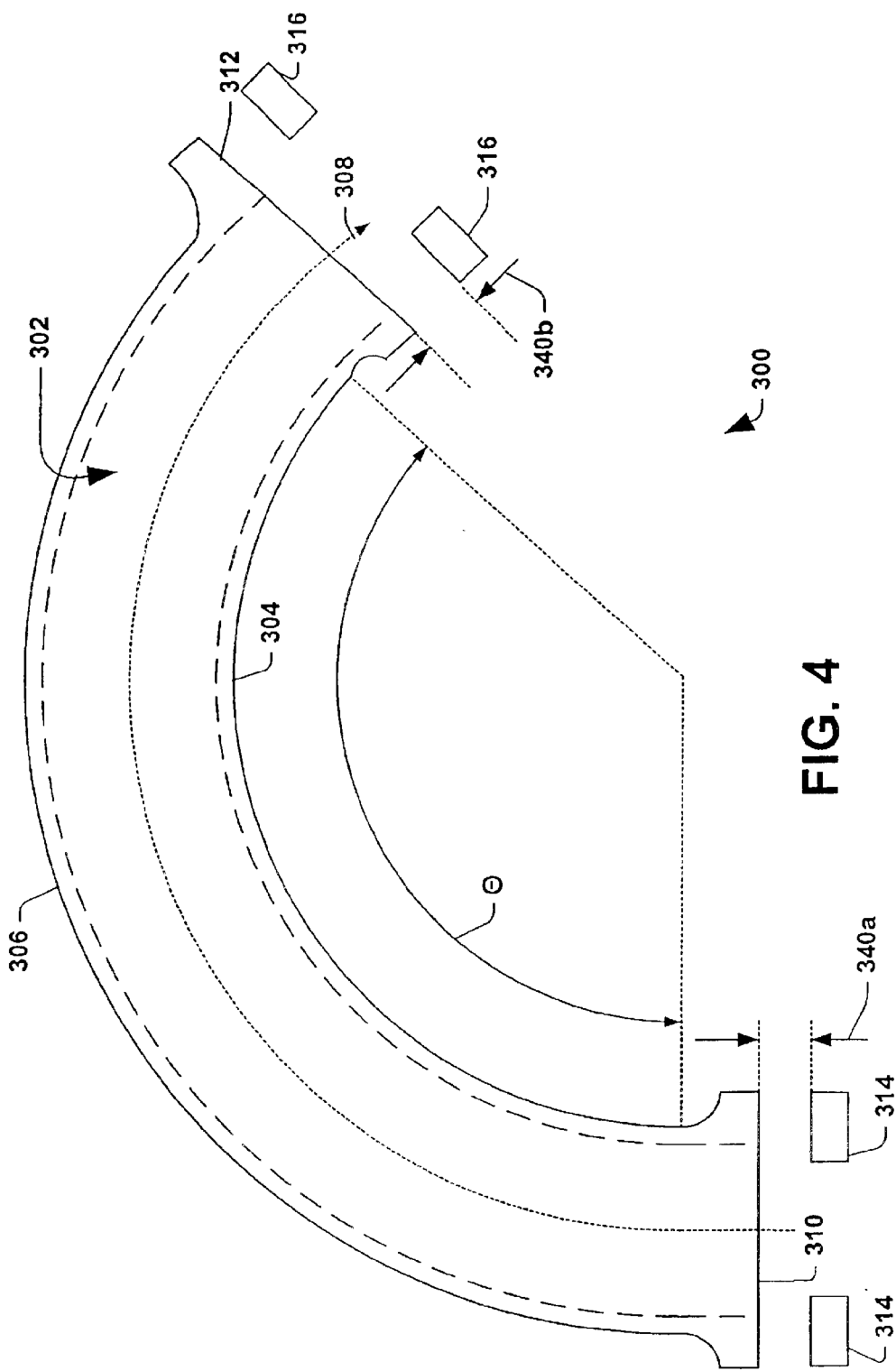
FIG. 4 is a top plan view of an exemplary mass analyzer beam guide according to an aspect of the invention.

FIG. 4 illustrates a simplified, exemplary mass analyzer beam guide 300 according to one aspect of the present invention for use in an ion implantation system (e.g., the analyzer 12 of FIG. 1, the analyzer 114 of FIG. 2, or the analyzer 280 of FIG. 3). The beam guide 300 has an arcuate longitudinal passageway 302 defined by inner and outer arcuate top and bottom walls 304 and 306, respectively, along an ion beam path 308. The beam guide 300 extends longitudinally along the path 308 from an entrance end 310 to an exit end 312 through an arc angle that may be approximately 135 degrees, for example. Beam guide 300 further comprises a mass analysis magnet that may comprise a pair of coils (not shown in FIG. 4) to provide a dipole magnetic field in the passageway 302 that allows ions of a selected charge-to-mass ratio to reach the exit end 312 along the path 308.

Still referring to FIG. 4, the mass analyzer 300 of the present invention comprises one or more field clamps 314, 316 located proximate to the entrance end 310 and/or the exit end 312 of the analyzer, respectively. The field clamps 314, 316 operate to substantially terminate fringing fields (not shown) associated with the dipole magnetic field within the passageway. Consequently, any such fringing fields are effectively shunted thereat, and an extent to which such fields extend outside the entrance end 310 and the exit end 312 is substantially reduced. Such reduction in the fringing fields reduces ribbon beam distortion, as will be more fully appreciated below.

Figure 5:
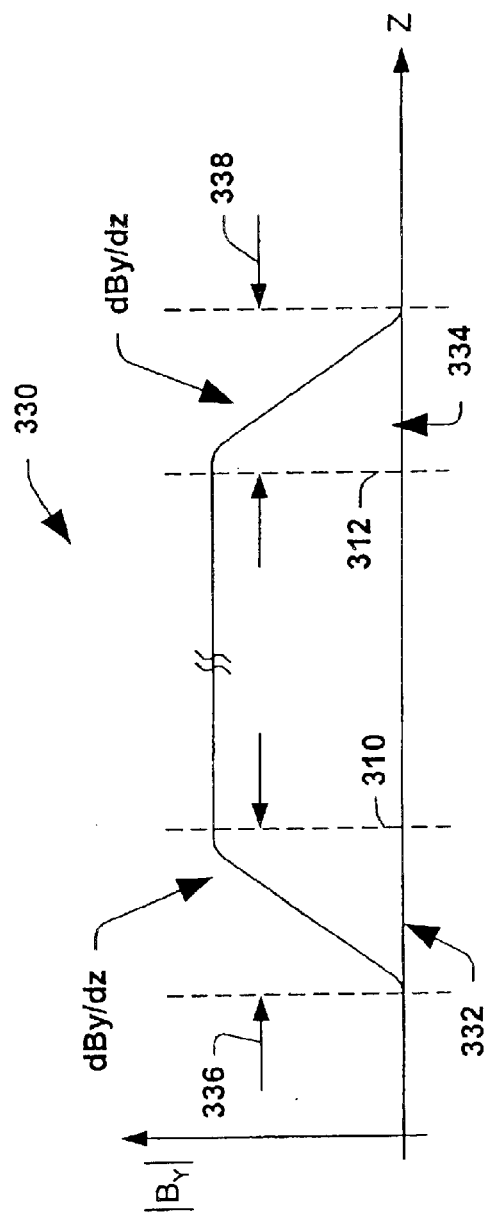
FIG. 5 is a graph illustrating fringing fields associated with a dipole magnetic field in a mass analyzer.

Turning to FIG. 5, a graph 330 is provided illustrating the magnetic field associated with the mass analyzer 300 of FIG. 4, wherein "Z" represents a direction of propagation of the beam along the beam path 308 within the passageway 302, and "$B_Y$" represents an absolute value of the magnetic field resulting from the coils employed for generation of the dipole field. Note that between the entrance end 310 and the exit end 312 within the mass analyzer 300, the magnetic field is substantially uniform. However, in a region 332 before the entrance end 310 and in a region 334 after the exit end 312, the magnetic field decays along the path 308 and comprises a gradient $dBy/dz$, wherein the gradient is a function of a distance 336, 338 beyond which the magnetic field is substantially negligible. The decaying field is a fringing field. The inventors of the present invention appreciated that the fringing fields associated with the dipole field within the mass analyzer is a cause of beam distortion, and further appreciated that although such fringing fields may not be eliminated, the effect of such fields on ribbon beam distortion could be substantially reduced in accordance with the present invention.

Figure 6:
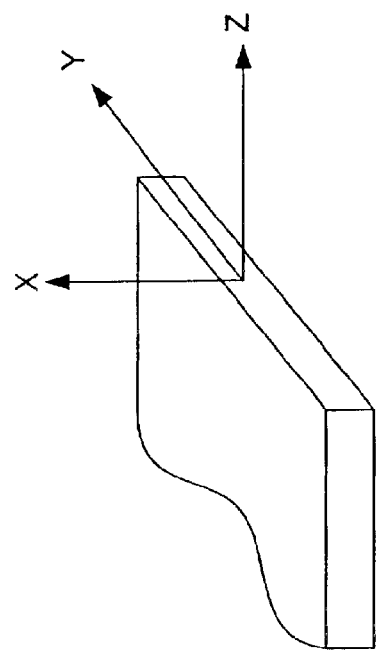
FIG. 6 is a perspective view of an exemplary ribbon beam according to an aspect of the present invention.

As appreciated by the inventors, Maxwell's equations describe that the gradient $dBy/dz$ is a varying magnetic field in space, which gives rise to a $dBz/dy$ field component, and thus the fringing fields also have a transversely non-uniform component. Consequently, as the ribbon beam travels along the beam path 308, the fringe fields operate to distort the ribbon beam non-uniformly along its width, or in the "Y" direction, as illustrated in FIG. 6.

Figure 7:
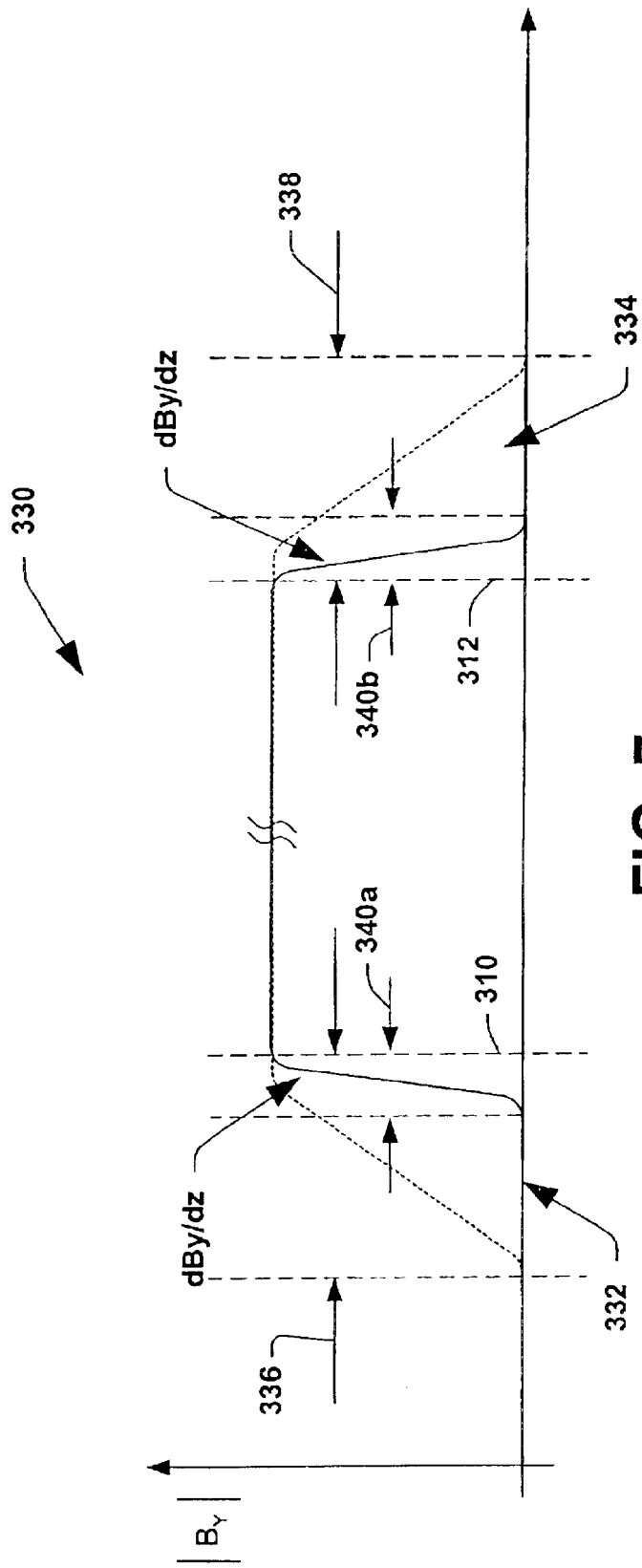
FIG. 7 is a graph illustrating an impact of field clamps on fringing fields associated with a dipole magnetic field in a mass analyzer according to the present invention.

Therefore by employing field clamps 314, 316 proximate the entrance and exit ends 310, 312 of the mass analyzer 300, an extent of the fringing fields is reduced. For example, referring to FIGS. 4 and 7, if the field clamps 314, 316 are located a distance 340a, 340b away from the entrance and exit ends, respectively, and such distances 340a, 340b are less than the distances 336, 338 at which the fringing fields naturally decay (FIG. 7), then beam distortion is reduced. Therefore if the ribbon beam is traveling with a given average velocity and the region having fringing fields associated therewith is reduced (340a, 340b<336, 338), then a time duration in which the beam is subjected to the fringing fields is greatly reduced, thus reducing beam distortion and improving beam uniformity along a width of the beam. Accordingly, the distance 340a, 340b is made as small as possible, wherein such distance is ultimately limited by saturation of the field clamp material. Thus the field clamps are positioned as close to the entrance and exit ends of the analyzer as possible without the field clamps becoming saturated. As may be appreciated, such distance may vary based on the material employed in the field clamp as well as the strength of the field in the mass analyzer.

Turning now to FIGS. 8–11B, a mass analyzer system 400 is illustrated, wherein the system is configured to mass analyze a ribbon-shaped ion beam. In one example, a ribbon beam is received from an ion source such as the ion source mentioned supra. The mass analyzer 400 of the present example is configured to mass analyze a ribbon beam for a 300 mm semiconductor wafer, and thus the ribbon beam may have a width of about 400 mm and the mass analyzer may have a width of about 600 mm.

Figure 9:
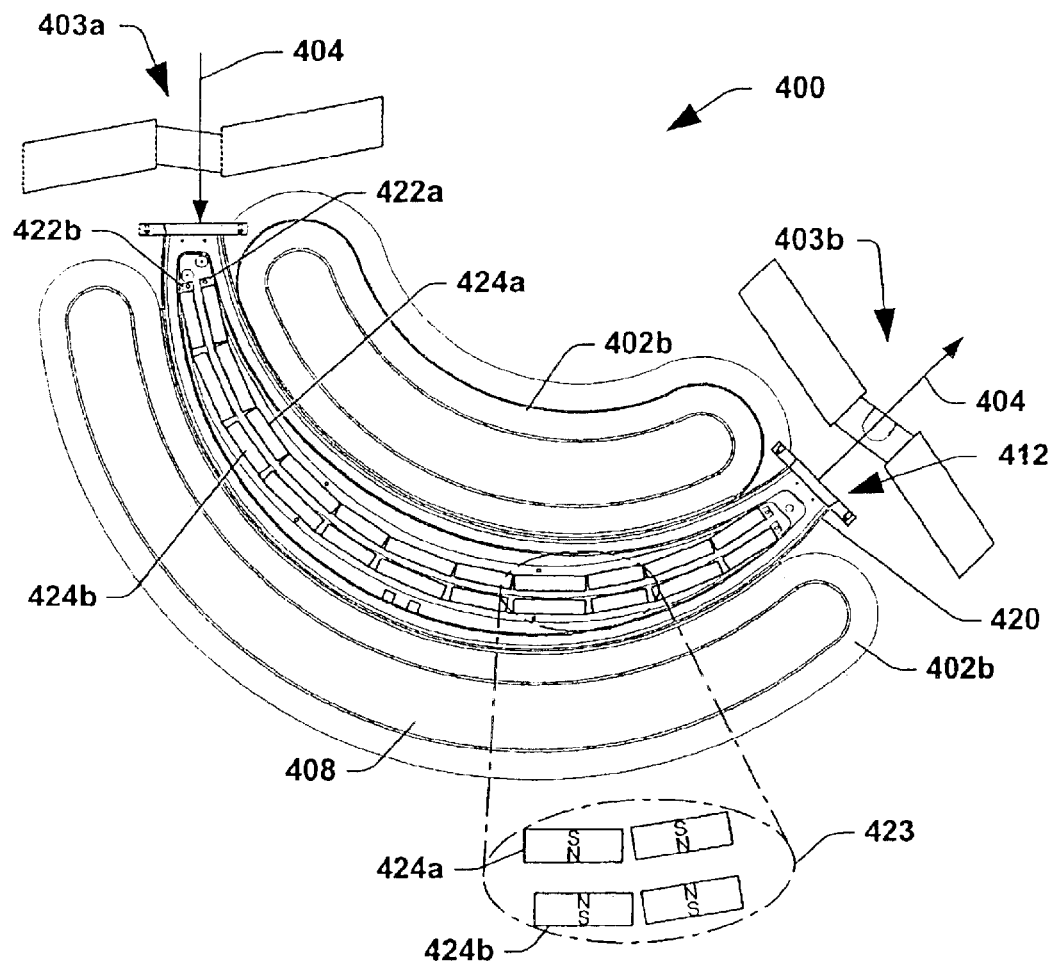
FIG. 9 is a side sectional view of a first lateral side of the exemplary mass analyzer of FIG. 8.
Figures 11A, 11B:
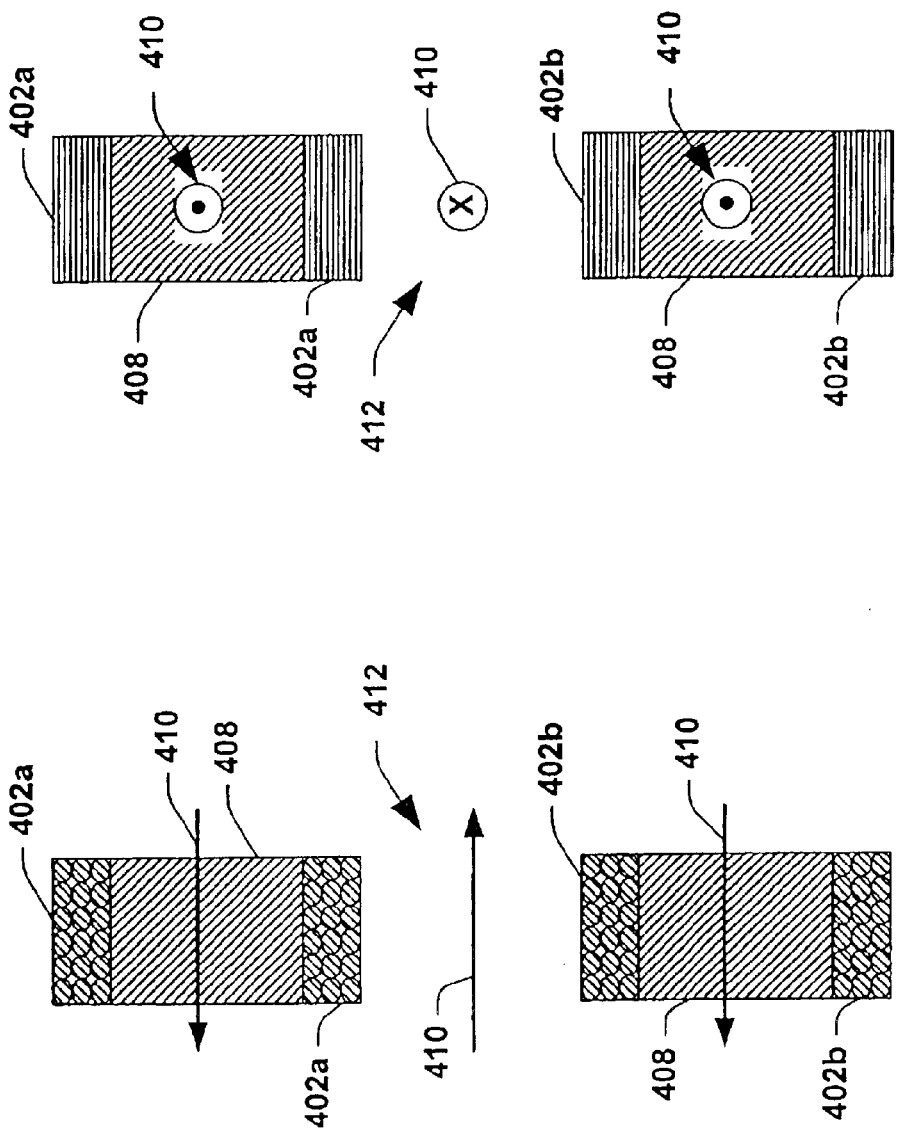
FIG. 11A is a cross section view of an exemplary mass analyzer for a ribbon beam taken along line 11A—11A of FIG. 10.
FIG. 11B is a cross section view of an exemplary mass analyzer for a ribbon beam taken along line 11B—11B of FIG. 8.

The mass analyzer 400 of the present example comprises a pair of coils 402, wherein a first coil (or top coil 402a in the illustrated orientation) resides over a second coil (or bottom coil) 402b with a beam path 404 disposed therebetween and extending therethrough from an entrance end 403a to an exit end 403b, respectively. Each coil 402 extends in a width direction 406 at least as far as the ribbon beam, and preferably further than the ribbon beam width. Referring to FIGS. 9 and 11A–11B, each coil 402 may comprise an arcuately-shaped yoke 408 having one or more conductors wrapped therearound, for example, in a longitudinal direction along the arcuate shape of the yoke and generally parallel to the beam path 404. Upon current conducting through the coils 402, a dipole magnetic field 410 is generated in a gap 412 between the coils in a direction generally perpendicular to a direction of propagation of the ribbon beam (which is generally coincident with the arcuate beam path 404).

Figure 8:
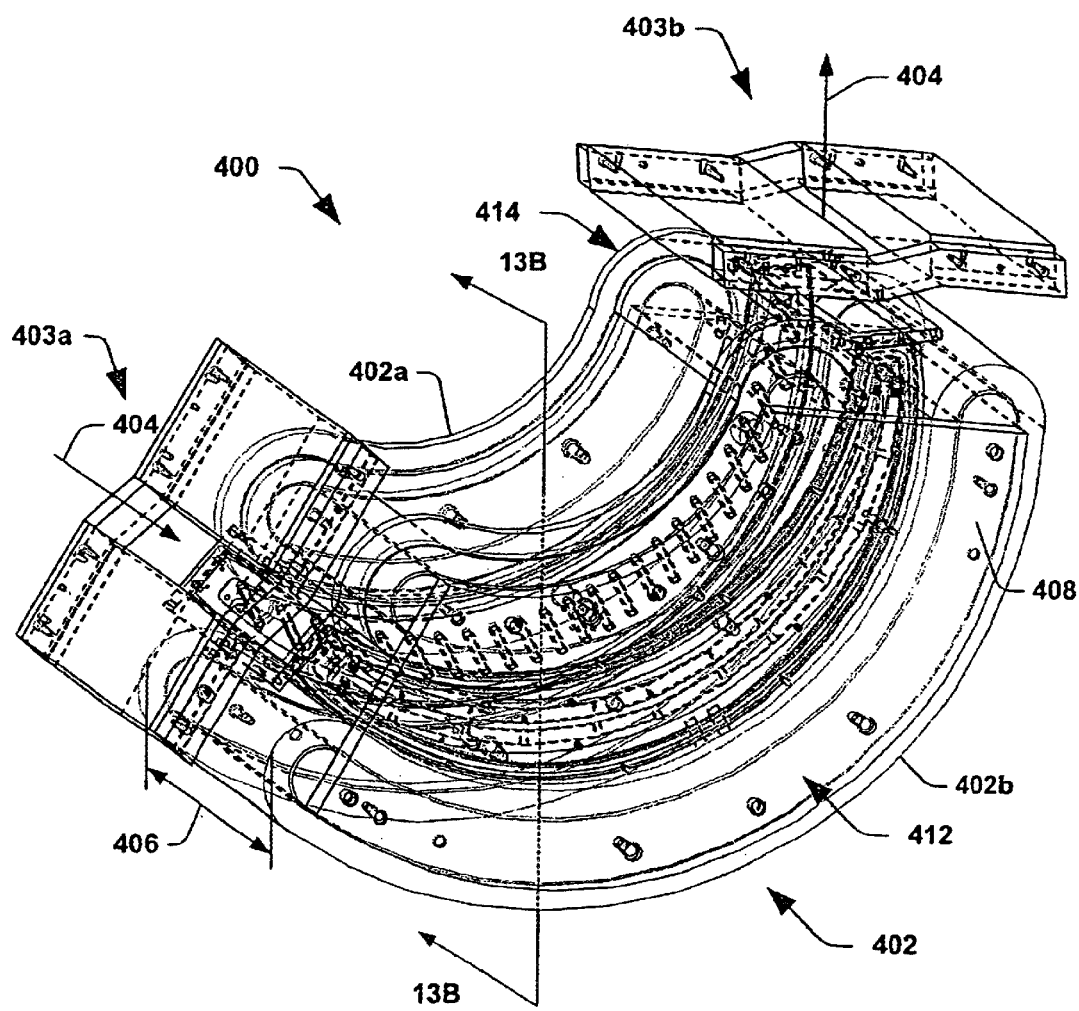
FIG. 8 is a perspective view of an exemplary mass analyzer for a ribbon beam in accordance with another aspect of the present invention.

Referring to FIGS. 8 and 9, the laterally extending coils 402 define laterally opposing sides 414 of the mass analyzer 400. Disposed on one of the sides 414a and positioned between the coils 402a and 402b is an arcuately extending, electrically insulating sidewall 420. On the sidewall 420 are two arcuately extending conductive segments 422a and 422b. Although the segments 422 are themselves conductive, the segments are electrically isolated from one another. On each segment 422 a plurality of electrodes 424a, 424b extend longitudinally along the arcuate path, wherein the electrodes 424 are concatenated therealong. Although the electrodes 424 are illustrated as a plurality of separate elements connected together electrically via the respective segment 422, it should be understood that each electrode 424 may comprise a single, arcuately extending conductive element as well as other configurations, and such alternatives are contemplated as falling within the scope of the present invention.

The electrodes 424a and 424b are coupled to a power source (not shown) such as an RF power source such that upon biasing, an electric field forms between the electrodes 424a and 424b in a direction that is generally perpendicular to the beam path 404. In one example, the electrodes 424 may be employed in conjunction with the dipole magnetic field 410 within the gap 412 (which is perpendicular to the electric field) to create electron trapping regions therein similar to a magnetron structure. As discussed above, the moving electrons collide with a gas (residual source gas or an input source gas such as xenon) for ionization thereof to generate a plasma.

In another aspect of the present invention, the electrodes 424 are also magnets (see FIG. 9), wherein each magnet 424 has a north pole and a south pole associated therewith. For example, in the first segment 422a within the enlarged region 423, the magnets have their poles aligned such that a north pole of each magnet faces inwardly toward a magnet 424b on the other conductive segment 422b, and has a south pole that faces outwardly away from the other magnet 424b. Further, in the second segment 422b, the magnets similarly have their poles aligned, however, the north pole of each magnet 424b faces inwardly toward a magnet 424a on the first conductive segment 422a, and has a south pole that faces outwardly away from the magnet 424a. With such a configuration, the magnets act as multi-cusp magnets operable to generate multi-cusp fields that extend into the arcuate passageway toward the beam path 404. Although one configuration is illustrated in FIG. 9, it should be understood that the magnet pole orientations may alternatively be reversed, wherein the south poles face inwardly and the north poles face outwardly, and such a variation is contemplated by the present invention.

The multi-cusp magnetic fields generated by the magnets 424 have portions that are perpendicular to the electric fields generated by the electrodes 424. By using the electrodes as magnets and using multi-cusp fields as the magnetic field generator, the multi-cusp fields can be tailored to maximize ionization efficiency without impacting the mass analysis function of the magnetic dipole field 410, as may be appreciated. In addition, by using the electrodes as magnets (similar structure for both the electric field generator and the magnetic field generator), the design can be simplified.

The plasma generated within the mass analyzer 400 may readily flow along magnetic field lines, such as the field lines associated with the dipole field 410, which in FIG. 9 is directed into the page and perpendicular to the ribbon beam. Thus the generated plasma is formed along the arcuate passageway in a relatively uniform manner and may then readily diffuse across the width 406 of the beam guide along the dipole field lines to provide a substantially uniform plasma across with width of the ribbon beam. Thus space charge neutralization of the ribbon beam may occur advantageously uniformly across a width thereof.

Figure 10:
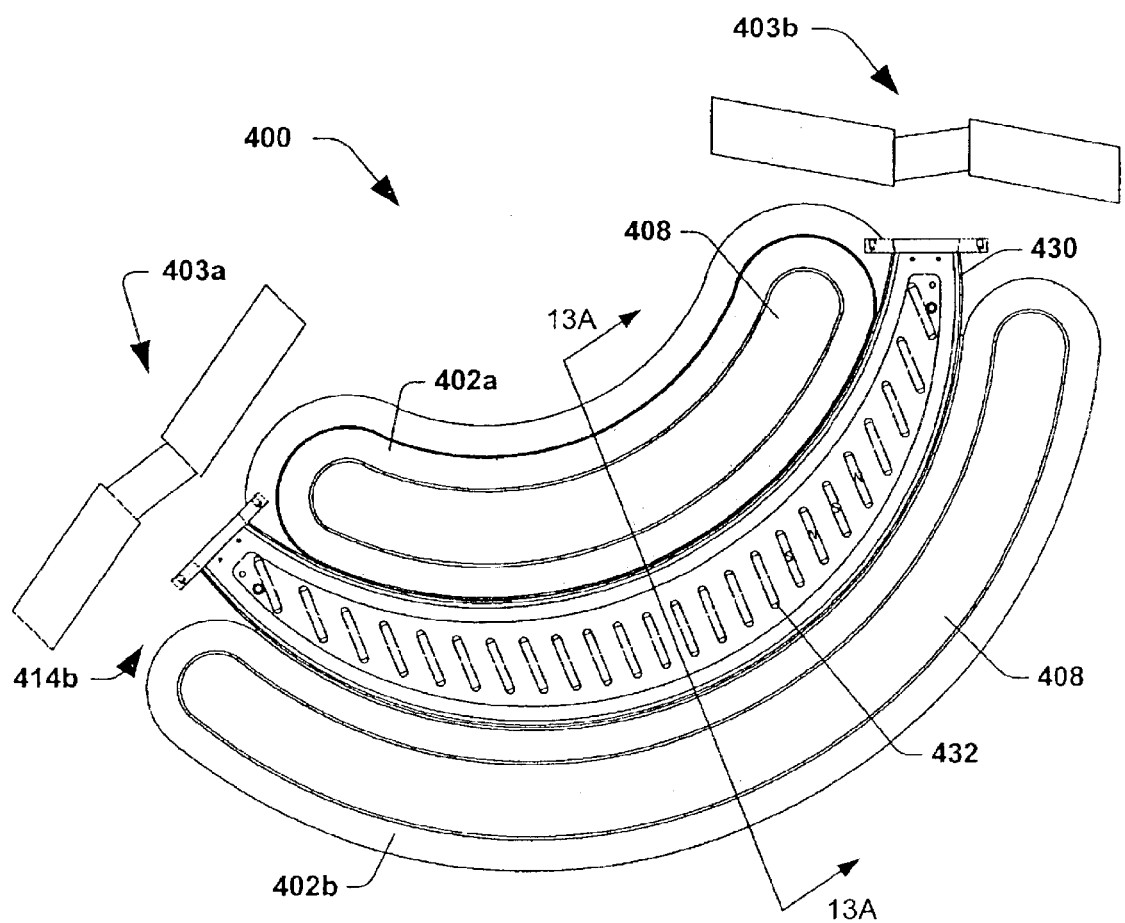
FIG. 10 is a side sectional view of a second lateral side of the mass analyzer of FIG. 8.

Referring now to FIGS. 8 and 10, on an opposing side of the beam guide 400 from the first sidewall 414a, an electrically insulating second sidewall 414b extends between the first and second coils 402a, 402b. The second sidewall 414b comprises an arcuately extending segment 430 that has a plurality of magnets 432 placed therealong. The magnets 432 are arranged along the segment 430 in a configuration such that the magnets are approximately rotated by 90 degrees with respect to the magnets 424 of the segments 422 on the first sidewall 420. In addition, the magnets 432 are arranged such that a north pole of one magnet is oriented next to a south pole of a neighboring magnet, as illustrated in FIG. 10. Having the second set of magnets 432 rotated with respect to the magnets 424 advantageously alters the phase of the multi-cusp fields on the opposing sides. When plasma diffuses across the ribbon beam along the dipole field lines 410 toward the multi-cusp fields formed with the magnets 432, the phase variation between the sides prevents or substantially mitigates dead zones from forming wherein plasma non-uniformities can occur.

Still referring to FIGS. 8–11B, a pair of field clamps 450a, 450b are located proximate the entrance end 403a and the exit end 403b of the analyzer. The field clamps 450 comprise a ferromagnetic material, for example, iron, and operate to substantially terminate fringing fields and thus prevent such fields from extending beyond the field clamps. In the present example, the field clamps 450 comprise iron members or bars extending along the width direction 406 of the analyzer 400 and the ribbon beam such that the fringe fields are terminated uniformly along the width of the beam. The field clamps 450 at each end are separated from one another by a distance 452 via a field clamp bracket 454 to allow the beam to pass therethrough. Alternatively, the field clamps 450 may comprise a horseshoe configuration, wherein portions extend across the width 406 and connect together at one or both sidewall portions. Any configuration of field clamp may be employed and such configurations are contemplated as falling within the scope of the present invention.

Figure 12B:
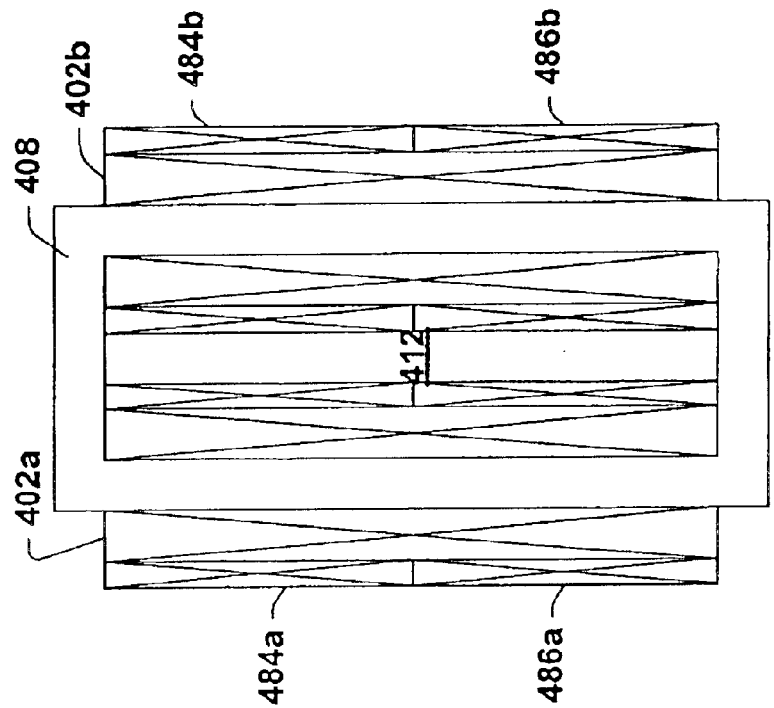
FIGS. 12A and 12B are cross sections end views of an exemplary mass analyzer illustrating primary coils and one or more sets of secondary coils according to another aspect of the present invention.
Figure 12A:
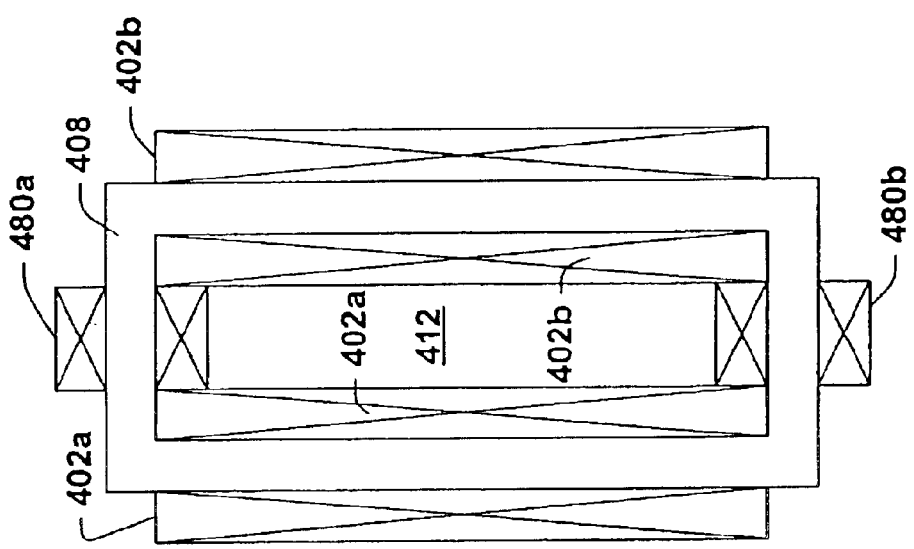

Turning now to FIGS. 12A and 12B, the mass analyzer of the present invention, in addition to employing the primary coils (402a, 402b) for the dipole field and field clamps for reduction of distortion due to fringing fields, may further comprise one or more sets of secondary coils for further compensation of detected or expected beam distortion. For example, as illustrated in FIG. 12A, a simplified view of the mass analyzer 400 looking into the exit end 403b thereof without the field clamps illustrated is provided. The analyzer is rotated approximately 90 degrees in the figure with respect to the orientation in FIGS. 8–10, and comprises the yoke 408 having the first and second coils 402a, 402b to define the top and bottom portions of the beam path 404 and the gap 412. The primary coils 402a, 402b operate to generate the dipole field in the gap 412.

As discussed above, the field clamps (not shown) operate to reduce an extent of the fringing field emanating from the entrance and exit ends of the mass analyzer. The field clamps operate to reduce beam distortion along the width thereof and thus improve beam uniformity. If, however, additional beam uniformity is desired, the beam uniformity can be detected and analyzed at the workpiece, for example, and fed back via a controller (not shown), for example, to a set of secondary coils 480 provided along the sidewalls of the analyzer 400 corresponding to the distal edges of the ribbon beam. Preferably, coils 480a and 480b on the opposite sidewall, are controlled separately from coils 402a and 402b. In particular: coils 402a and 402b may be independently controlled, such that the difference in currents produces a quadrupole field component. In such case, coils 480a and 480b are controlled such that the total current-turns product within the magnetic frame is nil. This condition in this example is necessary to prevent excessive magnetic flux density in the core material. In a preferred embodiment, coils 480a and 480b, are wound with the same number of turns as 402a or 402b, facilitating the condition of zero flux with simple power supply connections.

In yet another alternative, as illustrated in FIG. 12B, another set of secondary coils may comprise upper and lower sets of secondary coils 484a, 484b and 486a, 486b that are superimposed over the primary coils 402a, 402b. In this arrangement, another degree of freedom is enabled for providing compensation, wherein each of the coils are independently controllable to provide dipole field modification based on detected beam uniformity at or near the workpiece.

Figure 13:
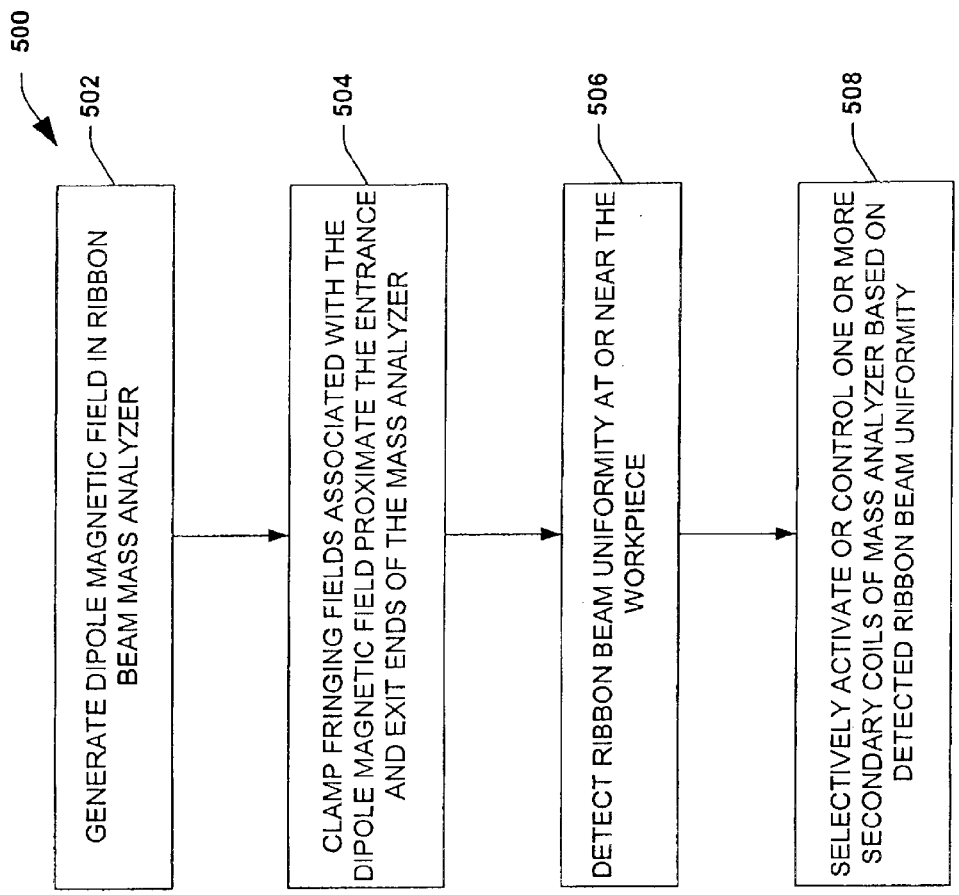
FIG. 13 is a flow chart diagram illustrating a method of mass analyzing a ribbon shaped ion beam according to yet another aspect of the present invention.

In accordance with yet another aspect of the present invention, a method of mass analyzing a ribbon beam is provided, as illustrated in FIG. 13 and designated at reference numeral 500. Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 500 begins at 502 with the generation of a dipole magnetic field in the ribbon beam mass analyzer, for example, by activating a pair of coils as discussed supra. The dipole field is operable to deflect selected ions within the ribbon beam along a predetermined arcuate path for mass analysis of the ribbon beam. At 504, fringing fields associated with the dipole magnetic field are clamped proximate the mass analyzer. In one example, the clamping of fringing fields comprises locating field clamps at one or both of the entrance and exit ends of the mass analyzer, wherein a distance between the field clamps and the mass analyzer is made as small as possible without saturation of the clamps. Consequently, the fringing fields emanating from the entrance and exit ends of the mass analyzer are clamped proximate thereto, thereby reducing an extent to which such fields emanate. As a result, the ribbon beam traversing the fringing fields are exposed to such distortion producing fields for a substantially reduced period of time, thereby reducing an amount of distortion to the ribbon beam.

At 506 the ribbon beam has left the mass analyzer employing the fringing field clamping, and is detected at or near the workpiece. For example, one or more faraday cups or other type detection mechanism(s) may be employed to detect the ribbon beam across it width and thus ascertain a uniformity associated therewith. The method 500 then continues at 508, wherein one or more secondary coils associated with the mass analyzer are selectively activated and/or controlled based on the detected ribbon beam uniformity for compensation thereof, if needed. For example, as highlighted supra with respect to FIGS. 12A and 12B one or more secondary coils may be activated and current therein independently varied to compensate for any detected non-uniformities across the width of the ribbon beam. In the above manner, improved beam uniformity is achieved with a ribbon shaped ion beam.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A method of mass analyzing a ribbon shaped ion beam, comprising:
   generating a substantially uniform dipole magnetic field for deflection of selected ions in the ribbon beam along an arcuate path; and
   limiting an extent of fringing fields associated with the substantially uniform dipole magnetic field.

2. The method of claim 1, wherein limiting the extend of the fringing fields comprises clamping the fringing fields within a predetermined area.

3. The method of claim 1, wherein the substantially uniform dipole magnetic field is generated within a mass analyzer having an entrance end and an exit end, respectively, and wherein limiting an extent of the fringing fields comprises limiting the extent the fringing fields emanate from the entrance end or the exit end of the mass analyzer.

4. The method of claim 3, wherein the extent of the fringing fields comprises clamping the fringing fields within a predetermined area proximate the entrance end or the exit end of the mass analyzer.

5. The method of claim 4, wherein clamping the fringing fields comprises placing a field clamp proximate the entrance end or the exit end of the mass analyzer.

6. The method of claim 5, wherein a distance between the field clamp and the entrance end or the exit end of the mass analyzer is sufficient to prevent saturation of the field clamp.

7. The method of claim 5, wherein the field clamp comprises an iron member having a top portion and a bottom portion, the top and bottom portions each extending along a width of the ribbon beam, wherein the ribbon beam passes therethrough.

8. The method of claim 1, further comprising detecting a uniformity of the ribbon beam after limiting the extent of the fringing fields.

9. The method of claim 8, wherein detecting the ribbon beam uniformity occurs at or near a workpiece being implanted with the ribbon beam.

10. The method of claim 8, wherein the dipole magnetic field is generated within a mass analyzer, further comprising controlling one or more coils associated with the mass analyzer based on the detected ribbon beam uniformity.

11. A method of mass analyzing a ribbon shaped ion beam, comprising:
    generating a dipole magnetic field within a mass analyzer having an entrance end and an exit end, for deflection of selected ions in the ribbon beam along an arcuate path; and
    limiting an extent of fringing fields associated with the dipole magnetic field emanating from the entrance end or the exit end of the mass analyzer.

* * * * *